(12) United States Patent
Sandhu

(10) Patent No.: US 7,598,021 B2
(45) Date of Patent: Oct. 6, 2009

(54) HIGH RESOLUTION PRINTING TECHNIQUE

(75) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 571 days.

(21) Appl. No.: 11/252,465

(22) Filed: Oct. 17, 2005

(65) Prior Publication Data

US 2007/0087290 A1 Apr. 19, 2007

(51) Int. Cl.
*G03F 7/20* (2006.01)
(52) U.S. Cl. .................................. 430/311; 430/322
(58) Field of Classification Search ................. 430/322, 430/311
See application file for complete search history.

(56) References Cited

U.S. PATENT DOCUMENTS

| | | | |
|---|---|---|---|
| 6,846,565 B2 | 1/2005 | Korgel et al. | |
| 2002/0063212 A1* | 5/2002 | Mirkin et al. | 250/306 |

OTHER PUBLICATIONS

"The 'millipede' project," Project overview, http://www.zurich.ibm.com/st/storage/millipede.html, Aug. 26, 2005.
"The 'millipede' project," Concept and components, http://www.zurich.ibm.com/st/storage/concept.html, Aug. 26, 2005.
"The 'millipede' project," Read/write/erase process, http://www.zurich.ibm.com/st/storage/process.html, Aug. 26, 2005.
"The 'millipede' project," Recording technology, http://www.zurich.ibm.com/st/storage/recording.html, Aug. 26, 2005.
"The 'millipede' project," Serve and media navigation, http://www.zurich.ibm.com/st/storage/navigation.html, Aug. 26, 2005.
"The 'millipede' project," Small-scale prototype, http://www.zurich.ibm.com/st/storage/prototype.html, Aug. 26, 2005.

(Continued)

*Primary Examiner*—Mark F Huff
*Assistant Examiner*—Caleen O Sullivan
(74) *Attorney, Agent, or Firm*—Knobbe, Martens, Olson & Bear LLP

(57) ABSTRACT

A pattern having exceptionally small features is printed on a partially fabricated integrated circuit during integrated circuit fabrication. The pattern is printed using an array of probes, each probe having: 1) a photocatalytic nanodot at its tip; and 2) an individually controlled light source. The surface of the partially fabricated integrated circuit comprises a photochemically active species. The active species undergoes a chemical change when contacted by the nanodot, when the nanodot is illuminated by light. To print a pattern, each probe raster-scans its associated nanodot across the surface of the partially fabricated integrated circuit. When the nanodot reaches a desired location, the nanodot is illuminated by the light source, catalyzing a change in the reactive species and, thus, printing at that location. Subsequently, reacted or unreacted species are selectively removed, thereby forming a mask pattern over the partially fabricated integrated circuit. The minimum size of the features in the pattern is determined by the size of the nanodot and can be very small, e.g., having critical dimensions of about 20 nm or less.

27 Claims, 10 Drawing Sheets

OTHER PUBLICATIONS

IBM's 'Millipede' Project Demonstrates Trillion-Bit Data Storage Density, http://domino.research.ibm.com/comm/pr.nsf/pages/news.20020611_millipede.html, Jun. 11, 2002.

http://lmis1.epfl.ch/webdav/site/lmis1/shared/Files/Lectures/Nanotechnology%20for%20engineers/Archives/2004_05/NT_tools%20for%20nanotech.pdf, Apr. 26 2005.

"Quantum Dots Used to 'Draw' Circuits for Molecular Computers of the Future," http://www.engineer.ucla.edu/stories/2003/qdots.htm, Mar. 28, 2003.

"User-Defined Nanopatterning," http://www.chemeng.ucla.edu/hmonbouquette/nanotechnology.htm, Jan. 18, 2005.

"Nanotechnology moves into the spotlight, etc.," Special Reports, Breakthroughs Magazine; Winter 2000-2001, http://www.pnl.gov/breakthroughs/win00-01/special.html.

"AZoNanotechnology Article, IBM's 'Millipede' Project Demonstrates Trillion-Bit Data Storage Density," http://www.azonano.com/details.asp?ArticleID=872, Jun. 11, 2002.

A. Brennan et al., "Plastic Fiber Optic Image Guides for Endoscopes," Nanoptics, Inc. -Fiber Optic White Paper, pp. 1-9, http://www.nanoptics.com/paper.htm, Aug. 26, 2005.

L. Grill et al., "Controlled manipulation of a single molecular wire along a copper atomic nanostructure," Physical Review B 69, 035416-1-7 (2004).

S. Hong et al., "A Nanoplotter with Both Parallel and Serial Writing Capabilities," Science, vol. 288, Jun. 2000, pp. 1808-1811.

T.A. Jung et al., "Controlled Room-Temperature Positioning of Individual Molecules: Molecular Flexure and Motion," Science, vol. 271, Jan. 1996, pp. 181-184.

J. Lü et al., "Positioning Isolation and Biochemical Analysis of Single DNA Molecules Based on Nanomanipulation and Single-Molecule PCR," J. Am. Chem. Soc. 2004, 126, 11136-11137.

F. Moresco, "Manipulation of large molecules by low-temperatures STM: model systems for molecular electronics," Physics Report 399 (2004) pp. 175-225.

G. Renaud et al., "Real-Time Monitoring of Growing Nanoparticles," Science, vol. 300, May 2003, pp. 1416-1419.

G. Thornton, "Watching Nanoparticles Grow," Science, vol. 300, May 2003, www.sciencemag.org, pp. 1378-1379.

P. Vettiger et al., "The 'Millipede'—Nanotechnology Entering Data Storage," IBM Research, Zurich Research Laboratory, pp. 1-22, Mar. 2002.

M. Warrier et al., "Photocatalytic reduction of aromatic azides to amines using CdS and CdSe nanoparticles," Photochem. Photobiol Sci., 2004, 3, pp. 859-863.

* cited by examiner

HIGH RESOLUTION PRINTING TECHNIQUE

BACKGROUND OF THE INVENTION

1. Field of the Invention

This invention relates generally to integrated circuit fabrication and, more particularly, to printing techniques.

2. Description of the Related Art

As a consequence of many factors, including demand for increased portability, computing power, memory capacity and energy efficiency, integrated circuits are continuously being made more dense. The sizes of the constituent features that form the integrated circuits, e.g., electrical devices and interconnect lines, are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In general, a capacitor-based memory cell, such as in conventional DRAM, typically includes two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM). By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. Just as a slide has an image to be projected onto a screen, the reticle typically has a pattern to be transferred to a substrate. By directing light or radiation through the reticle, the pattern in the reticle can be focused on the photoresist. The light or radiation causes a chemical change in the illuminated parts of the photoresist, which allows those parts to be selectively retained, or removed, relative to parts which were in the shadows. Thus, exposed and unexposed material form a pattern in the photoresist. It will be appreciated that this pattern can be used as a mask to form various features of an integrated circuit, including conductive lines or parts of electrical devices.

Because lithography is typically accomplished by projecting light or radiation onto a surface, the ultimate resolution of a particular lithography technique depends upon factors such as optics and light or radiation wavelength. For example, the ability to focus well-defined patterns onto resist depends upon the size of the features and on the wavelength of the radiation projected through the reticle. It will be appreciated that resolution decreases with increasing wavelength, due, among other things, to diffraction. Thus, shorter wavelength radiation is typically required to form well-resolved features, as the sizes of the features decrease. Consequently, to facilitate reductions in feature sizes, lower and lower wavelength systems have been proposed.

For example, 365 nm, 248 nm, 193 nm and 157 nm wavelength systems have been developed as features sizes have decreased. Additional reductions in feature sizes, e.g., down to 20 nm features, may require even shorter wavelength systems. For example, X-ray based lithography, using X-ray radiation instead of light, has been proposed to form very small features, such as 20 nm features. Another proposed technology is extreme ultraviolet (EUV) lithography, using, e.g., 13.7 nm radiation. X-ray and EUV lithography, however, are expected to be prohibitively expensive to implement. In addition to cost, the technique faces various technical obstacles. For example, for X-ray lithography, these obstacles include difficulties in forming high quality reticles which are sufficiently opaque to X-rays and difficulties in devising resists which are sufficiently sensitive to the X-rays. Moreover, rather than using optics to focus radiation on the resist, some X-ray systems place the reticle close to the resist, to directly expose the resist to X-rays passing through the reticle. This can cause complications in aligning the reticle with the resist and, in addition, places significant demands on the flatness of both the reticle and the resist. In addition, X-ray lithography can use reflective as opposed to refractive optics, which can require a complete redesign of optical elements and related systems. Similarly, other high resolution lithography techniques, including ion beam and electron beam lithography, have their own technical and practical obstacles, including high complexity and costs.

Accordingly, there is a continuing need for high resolution methods to pattern small features on semiconductor substrates.

SUMMARY OF THE INVENTION

According to one aspect of the invention, a method is provided for fabricating an integrated circuit. The method comprises moving an array of spaced nanodots over a surface of a partially fabricated integrated circuit. Light energy is directed to the nanodot when the nanodot is positioned over a desired location on the surface.

According to another aspect of the invention, a method is provided for printing a pattern over a semiconductor substrate. The method comprises providing a photochemically active material over the partially fabricated integrated circuit. Also provided is a micromechanical system comprising a probe comprising a tip which terminates in a nanodot. The nanodot is moved across a surface of the material. The nanodot is intermittently irradiated to cause a chemical reaction at an interface of the nanodot and the surface.

According to yet another aspect of the invention, a method is provided for patterning a surface of a partially fabricated integrated circuit. The method comprises irradiating selected areas of the surface to define a pattern on a portion of the selected areas.

According to another aspect of the invention, a method is provided for semiconductor processing. The method comprises providing a semiconductor substrate having an overlying masking layer which comprises a reactive chemical species. The reactive species is converted into an other chemical species by mechanically contacting the surface with a tip attached to a micromechanical system. The reactive chemical species or the other chemical species is selectively removed to form a pattern in the masking layer.

According to yet another aspect of the invention, a system is provided for printing patterns on a surface of a partially fabricated integrated circuit. The system comprises an array of micro-scanners. Each micro-scanner comprises an elongated probe comprising a tip terminating in a nanodot. Each micro-scanner further comprises an independently controlled radiation source.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
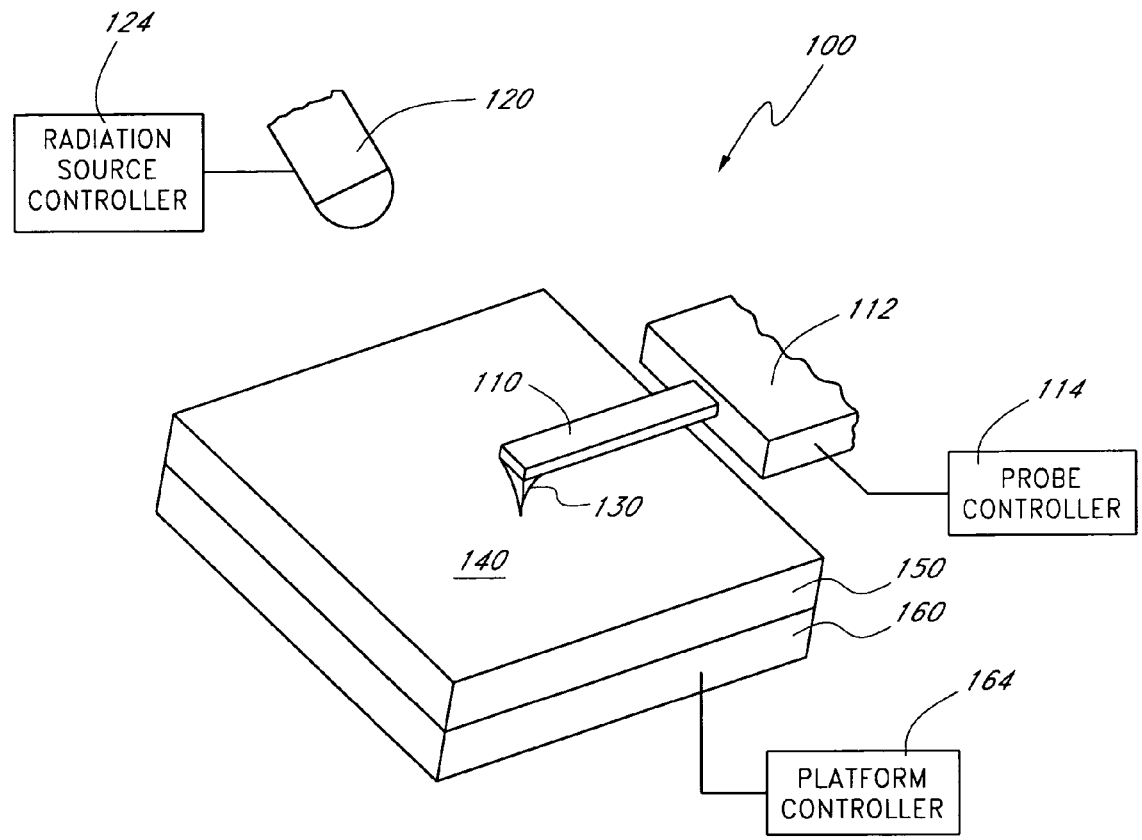
FIGS. 1A and 1B are schematic, perspective views of micro-scanner probes overlying a substrate, in accordance with preferred embodiments of the invention.

In preferred embodiments of the invention, a pattern is printed by directly contacting a surface with a micro-scanner probe. The printing is accomplished by causing a chemical reaction in the surface, to transform a material on the surface into another chemical species. The chemical reaction, in turn, is preferably caused by simultaneously contacting the surface with the tip of the probe and exposing the surface to radiation, e.g., light.

Preferably, the tip of the probe is catalytically active. More preferably, the tip of the probe comprises a nanodot to allow exceptionally small features to be printed, as discussed below. In addition, the material overlying the substrate is preferably photochemically active and undergoes a chemical transformation upon being contacted by the probe tip when the tip is irradiated, e.g., exposed to light energy. In addition, each probe preferably has an associated light source which can be switched on or off as desired. As used herein, the combination of the probe and the radiation source constitutes a "microscanner."

To print a pattern, the probe is moved along a predefined path on the surface of the material to be printed, so that the location of the probe on the material can readily be determined. For example, the probe can be raster scanned on the surface of the material. Upon reaching a location where writing, e.g., a chemical change, is desired, the nanodot and/or material is illuminated, thereby causing a chemical transformation. After a desired pattern is printed, the reacted material is selectively removed or retained relative to unreacted material, thereby forming a mask pattern of, e.g., vias and trenches. In some embodiments, the pattern is transferred to an underlying hardmask layer, which is then used to transfer the pattern to a substrate in a process to form, e.g., interconnects or electrical devices in an integrated circuit.

Preferably, to increase overall printing speed, an array of probes, each with an associated independently controlled light source, is used. The probes are preferably regularly spaced, thereby allowing an array of spaced nanodots, each nanodot attached to a probe, to print on a surface. Preferably, each probe independently prints on an area of a surface to form a desired pattern. Printing in a particular part of the surface is individually controlled by controlling irradiation of that area.

It will be appreciated that the probes and/or the surface on which printing is desired can be moved. In some embodiments, each probe has an associated actuator to independently move that probe. For example, the actuator can be a piezoelectric actuator which raster scans the probe over an area. In other embodiments, the probe or probes are held stationary and the substrate surface is moved.

Advantageously, printing by direct mechanical contact with a surface removes limitations imposed by optics or diffraction. Rather, minimum dimensions of the features to be formed can be used to determine the size of the tip used to print a pattern. Moreover, the probe arrays can be manufactured by relatively cost-effective microelectromechanical systems (MEMS) techniques. Thus, the preferred embodiments allow for reliable and cost-effective printing of very small features.

Reference will now be made to the Figures, wherein like numerals refer to like parts throughout. It will be appreciated that the Figures are not necessarily drawn to scale.

A microscanner 100 is shown in FIG. 1A. The microscanner 100 comprises a probe 110 and a radiation source 120. The radiation source 120 is connected to a radiation source controller 124 which controls the emission of radiation, e.g., light, from the radiation source 120. It will be appreciated that that radiation source 120 can be a radiation generator, e.g., a lamp, or can be a conduit for radiation transmission. Preferably, the radiation source 120 is a micro-fiberoptic cable which conveys light generated from a lamp to the microscanner 100. The radiation emission can be controlled by turning the radiation generator on/off or by switches in the controller 124 which block or permit the transmission of the radiation.

With continued reference to FIG. 1A, the probe 110 is a cantilever having a tip 130 and is preferably connected to a mount 112, used to position the probe 1 10 relative to a partially fabricated integrated circuit 150. The tip 130 preferably terminates in a nanodot. As illustrated, the nanodot contacts the surface 140 of the partially fabricated integrated circuit 150, which has been moved into position beneath the microscanner 100.

It will be appreciated that the nanodots are formed by various methods known in the art, using, e.g., CVD or other such techniques. For example, in some embodiments, the nanodots are formed on a surface and then attached to the tip of a probe 110. The attachment occurs by electrostatic attraction between the nanodot and the tip, when the tip is brought into close proximity with the nanodot, or by mechanical force, e.g., the tip is forced down on the nanodot, thereby adhering to and picking up the nanodot. The nanodot can also be welded to the tip by focused ion beam (FIB) or other nanoprobe based techniques. In other non-limiting examples, the nanodots are grown on the tip of the probe 110 by immersing the tip in a solution of precursor material.

Advantageously, the size of the nanodot is chosen depending on the desired printing resolution. For example, to print 20 nm features, the maximum dimension of the nanodot in contact with the surface 140 is preferably about 20 nm or less across and, more preferably, about 15 nm or less across. To print even smaller features, the maximum dimension of the nanodot in contact with the surface 140 can be about 10 nm or less, about 5 nm or less, or about 1 nm or less. It will be appreciated that the size of the nanodot roughly determines the size of the printed feature, with some adjustment depending upon, e.g., the selectivity of the print reaction to contact by the nanodot. In some cases, wet or dry etch techniques can form nanodots having sizes as small as one atom.

In the illustrated embodiment, the nanodot is formed of cadmium and sulfur or cadmium and selenium (CdS or CdSe). Advantageously, nanodots such as CdS and CdSe nanodots are electron donors which can give up electrons upon being excited by light energy. Preferably, the electron is transferred to the surface 140 to cause a chemical transformation in the material forming the surface 140. An example of such a chemical transformation is disclosed in Warrier et al., Photochem. Photobiol. Sci., 2004, 859-863, the entire disclosure of which is incorporated herein by reference. Catalytic reactions on surfaces using nanodots are also discussed at http://www.chemeng.ucla.edu/hmonbouguette/nanotechnology.htm and http://www.engineer.ucla.edu/stories/2003/qdots.htm, the entire disclosures of which are also incorporated herein by reference.

Preferably, the surface 140 comprises an aromatic azide, which is reduced to an aromatic amine by electron transfer from an excited CdS or CdSe nanodot, as represented below:

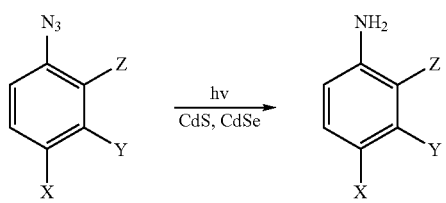

As shown in the chemical structure above, the aromatic azide can include various substituents X, Y and Z. Nonlimiting examples of possible substituents are provided in Table 1.

TABLE 1

| X | Y | Z |
|---|---|---|
| $NO_2$ | H | H |
| H | $NO_2$ | H |
| H | H | $NO_2$ |
| $CO_2H$ | H | H |
| H | $CO_2H$ | H |
| COMe | H | H |
| H | OMe | H |

TABLE 1-continued

| X | Y | Z |
|---|---|---|
| OMe | H | H |
| Cl | H | H |
| $(CH_2)_2OH$ | H | H |
| MeO | $NO_2$ | H |
| MeO | $CO_2Me$ | H |

In some embodiments, the surface 140 comprises a species which forms a self-assembling monolayer. For example, a photochemically active moiety, such as an aromatic azide, may be provided with a substituent which is reactive with a substrate on which the monolayer is to be formed. In some arrangements, the "reactive" ligand can be chemically reactive (e.g., forming covalent bonds) with the substrate surface or can be electrostatically attracted to the substrate. More preferably, the ligand is chemically reactive with the substrate and is not reactive with the photochemically active moiety, thereby forming a self-terminating monolayer on the substrate. The substituent reactive with the substrate is preferably also a long chain species, e.g., a hydrocarbon terminated by a moiety reactive with the substrate, to block and prevent unwanted reactivity with the substrate surface.

To print on the surface 140, the probe 110 is preferably moved with a predetermined velocity along a predetermined path on the surface. More preferably, the probe 110 is raster scanned at a constant velocity on the surface. Thus, the location of the tip 130 and attached nanodot at any moment in time can be calculated, e.g., by reference to the tip's starting position, lateral velocity and direction of movement. In some embodiments, the location of the tip 130 and the attached nanodot can be determined in real time by using various active location sensing techniques, including, e.g., using lasers (which, e.g., impinge on the tip or nanodot) and magnetic or electromagnetic field based probes. It will be appreciated that the location sensing technique is preferably selected based on compatibility with the material forming the tip or nanodot. For example, magnetic and electromagnetic systems are preferably used in cases where the tip 130 or nanodot is formed of a material that can be sensed magnetically or electromagnetically, respectively.

Upon coming to a location on the surface where printing is desired, the nanodot at the tip of the probe 110 is illuminated by light from the radiation source 120, causing the nanodot to enter an excited state in which it donates an electron to the aromatic azide on the substrate surface, thereby reducing the azide to form an aromatic amine. Thus, printing can be controlled by controlling the timing of the irradiation relative to the location of the nanodot. For example, to draw a line, the nanodot is illuminated when it moves over the path of the line.

It will be appreciated that the electrons donated by the nanodot are preferably replenished to catalyze additional reactions. This replenishment can be accomplished by placing the nanodot in contact with a sacrificial electron donor, which is provided in excess to fill electron holes left by the reduction reaction shown above. In the exemplary embodiment, the nanodot and the surface 140 are immersed in a solution containing the sacrificial electron donor, e.g., a sodium formate ($HCO_2Na$) solution.

It will also be appreciated that the material forming the surface 140 may absorb broadband light energy emitted from the radiation source 120, which may provide sufficient energy to cause unintended reactions in that material. To avoid such unintended reactions, the material and the nanodot are preferably chosen to have different absorption spectra and, more preferably, have a large difference in absorption at some wavelengths. Thus, the photochemically active material on the surface 140 preferably absorbs less light at some wavelengths than the nanodots. For example, CdS has an absorption maxima at about 350 nm and CdSe has an absorption maxima at about 425 nm. Advantageously, many aromatic azides absorb significantly less light at wavelengths of about 450 nm or lower, or wavelengths of about 400 nm or lower, than CdS or CdSe. Thus, reaction selectivity (selective to contact by a nanodot) can be increased by using light of a narrow band, or by the use of filters to filter out light of certain frequencies, e.g., light at the wavelengths away from the absorption maxima of CdS or CdSe.

Preferably, where the reactive species on the surface 140 is an aromatic azide, the aromatic ring is substituted at the ortho and/or para positions, which as been found to increase reaction efficiency relative to substitution at the meta position. More preferably, the aromatic ring is only substituted at one position. It has been found that substitution at two positions results in high light absorption at close to the same frequencies as the peak wavelengths of light absorption for the CdS and CdSe nanodots, which can reduce the selectivity with which the azide is transformed into an amine. As discussed above, high light absorption by the aromatic ring can cause reduction of the azide without electron donation from a nanodot, leading to undesired printing on the surface 140.

With continued reference to FIG. 1A, movement of the probe on the surface 140 can be accomplished in various ways. For example, the mount 112 can be an actuator, which moves the probe 110 to allow for, e.g., raster scanning of the surface 140. A probe controller 114 connected to the actuator controls actuator movement. In other embodiments, the partially fabricated integrated circuit 150 is positioned on a movable platform 160 and the probe 110 is held stationary. The platform 160 moves the partially fabricated integrated circuit 150 relative to the probe 110. The movement of the platform is controlled by a platform controller 164. In yet other embodiments, both the platform 160 and the actuator or mount 112 are provided to allow movement of both the partially fabricated integrated circuit 150 and the probe 110. It will be appreciated that the actuator 112 and/or the platform 160 can comprise piezoelectric actuators, which allow for movement with a high degree of precision.

With continued reference to FIG. 1A, preferably, as in the illustrated embodiment, the probe 110 extends laterally. It will be appreciated that a laterally-extending probe 110 has advantages for increasing tolerances for alignment with the surface 140. For example, the probe 110 has some amount of flex and will give slightly if the surface 140 is closer to the microscanner 100 than desired. In addition, as discussed in greater detail below, an array of microscanners 100 can be provided to increase printing throughput. It will be appreciated that there may be some variability in both the positions of the tips 130 of the array and in the height of the surface 140. Advantageously, the ability of the probes 110 to flex allows them to absorb some of these non-uniformities in flatness.

Figure 1B:
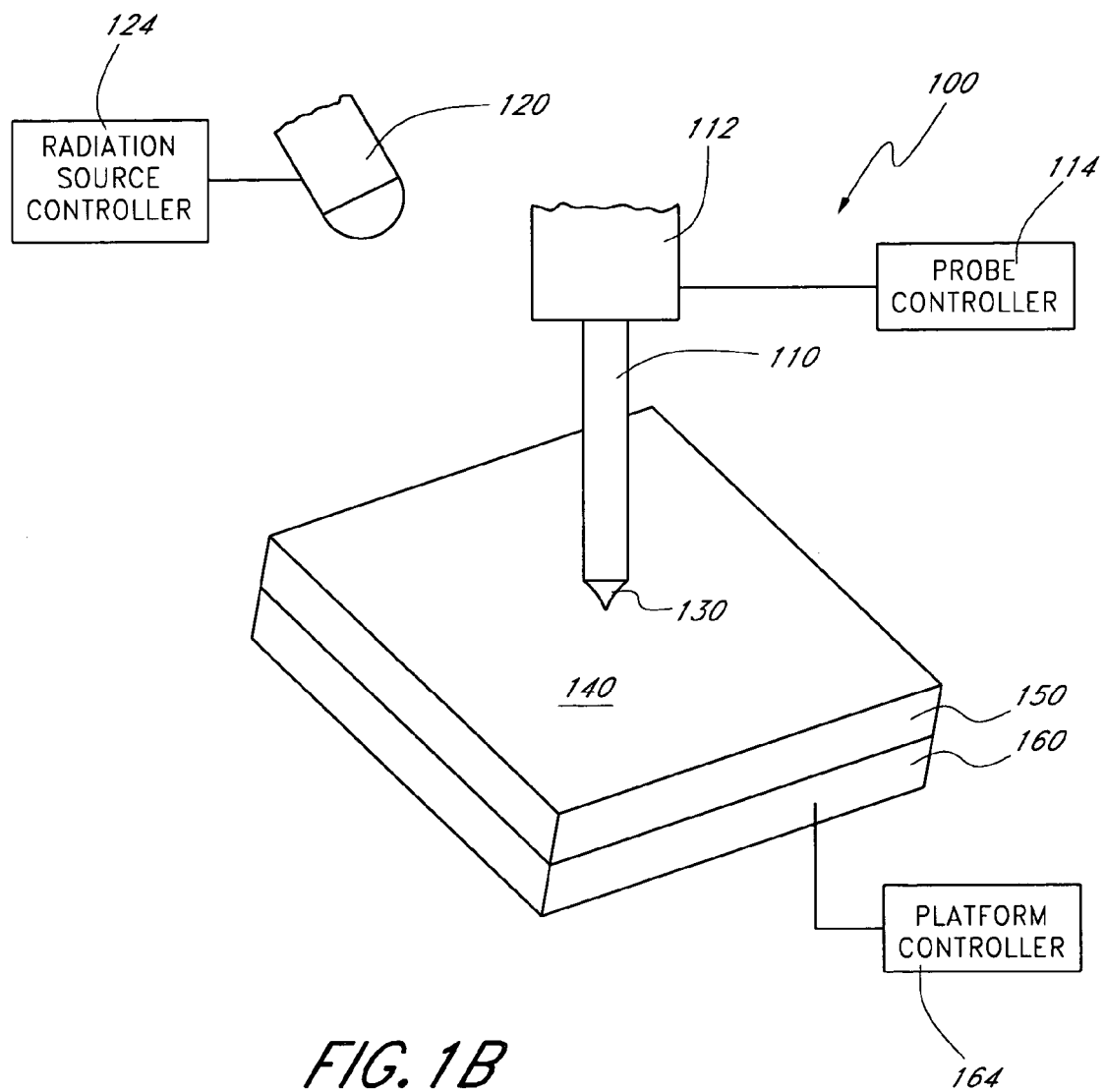

With reference to FIG. 1B, wherein like numerals refer to like parts of FIG. 1A, in some embodiments, the probe 110 can also be provided as a vertically-extending structure, which terminates in a tip 130, which in turn terminates in a nanodot. Preferably, in these embodiments, the probe 110 also has some give, to account for non-uniformiities in probe 110 length and surface 140 flatness, as discussed above. For example, in some embodiments, the probe 110 may be allowed to move into the mount 112 to a degree.

Figure 2:
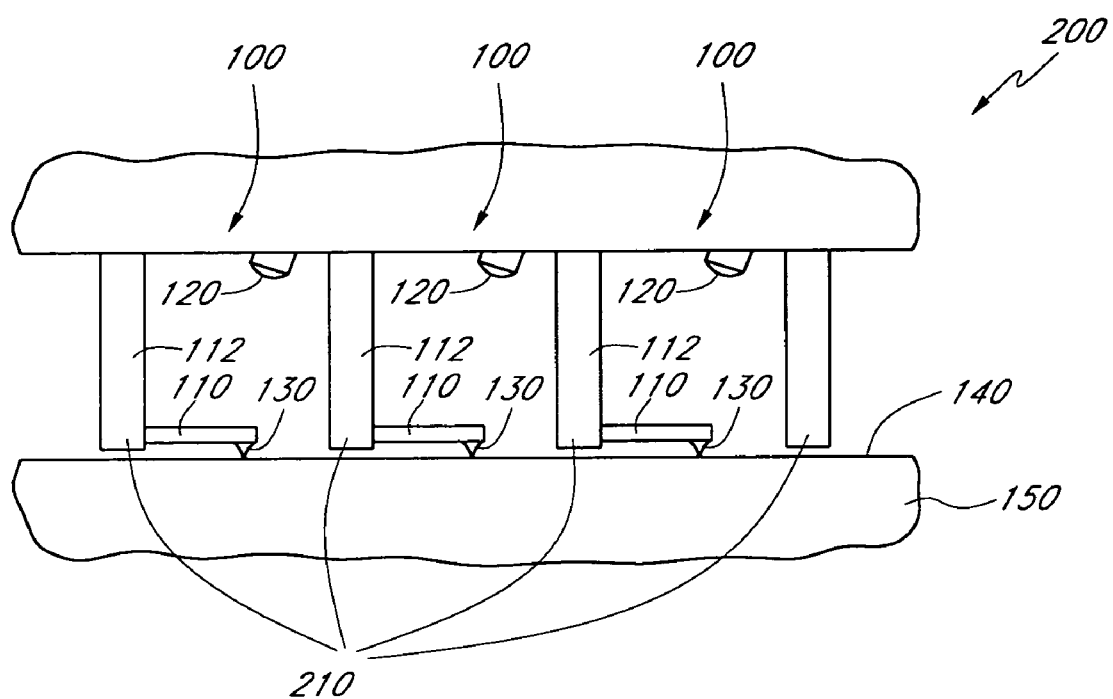
FIG. 2 is a schematic, cross-sectional side view of an array of the micro-scanners of FIGS. 1A and 1B, in accordance with preferred embodiments of the invention.

With reference to FIG. 2, a plurality of the microscanners 100 can be provided in an array 200 to increase printing throughput. The tips 130 of the probes 110 of the array 200 are used to print, as discussed above. In operation, each tip 130 is moved, e.g., raster scanned, along a predefined path over a particular area or part of the surface 140. The radiation sources 120 are independently controlled and illuminate an associated tip 130 upon the nanodot at the tip 130 arriving at a location where printing is desired. Thus, depending upon the location of the various tips 130, the light sources independently and selectively emit light to write to the surface 140.

Each tip 130 is preferably used to print over a particular associated area, e.g., a square of less than about 100 μm in width and, preferably, about 50-100 μm in width. Preferably, the radiation source 120 of each microscanner 100 is smaller than the size of this associated area. Advantageously, light can be provided with micro-fiberoptic cable, which can formed with diameters of less than about 100 μm.

Figure 3A:
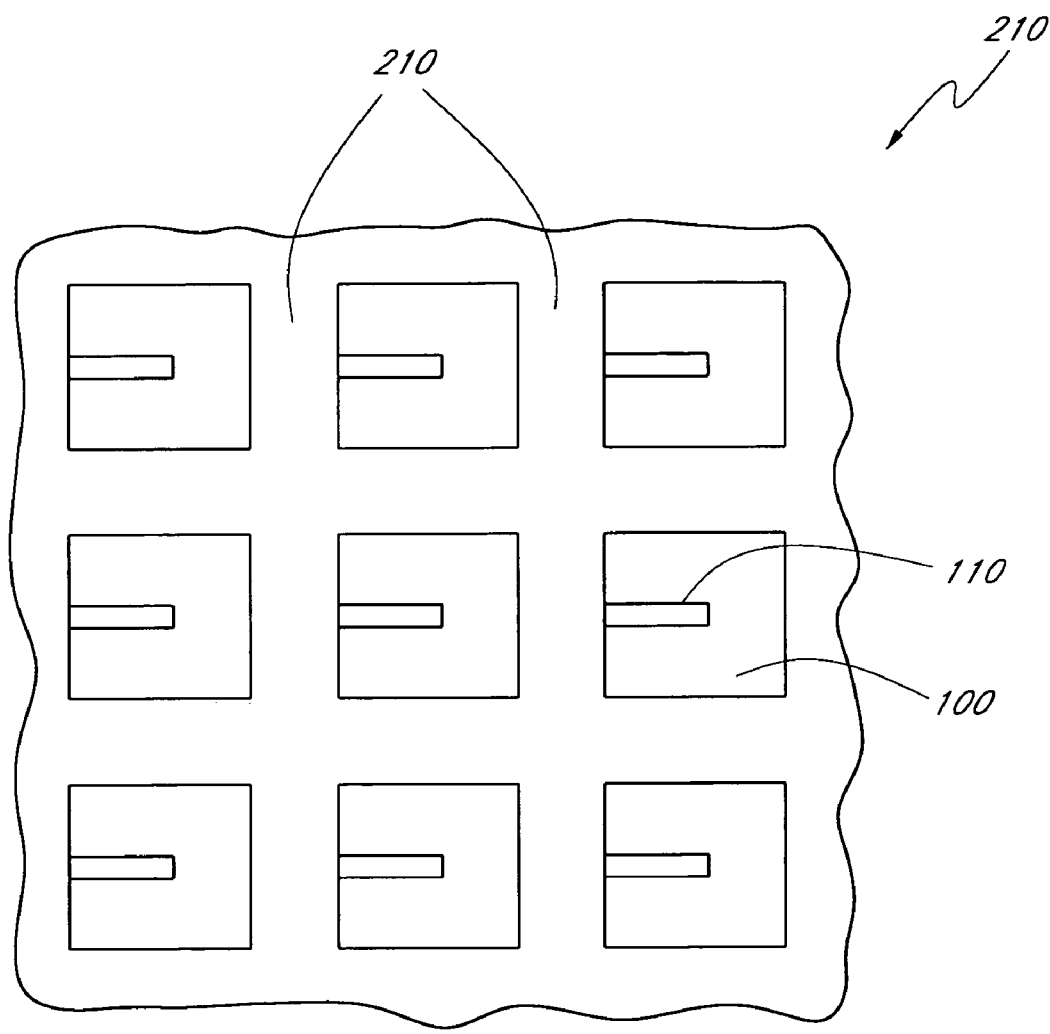
FIG. 3A is a schematic top-down plan view of the array of FIG. 2, in accordance with some preferred embodiments of the invention.
Figure 3B:
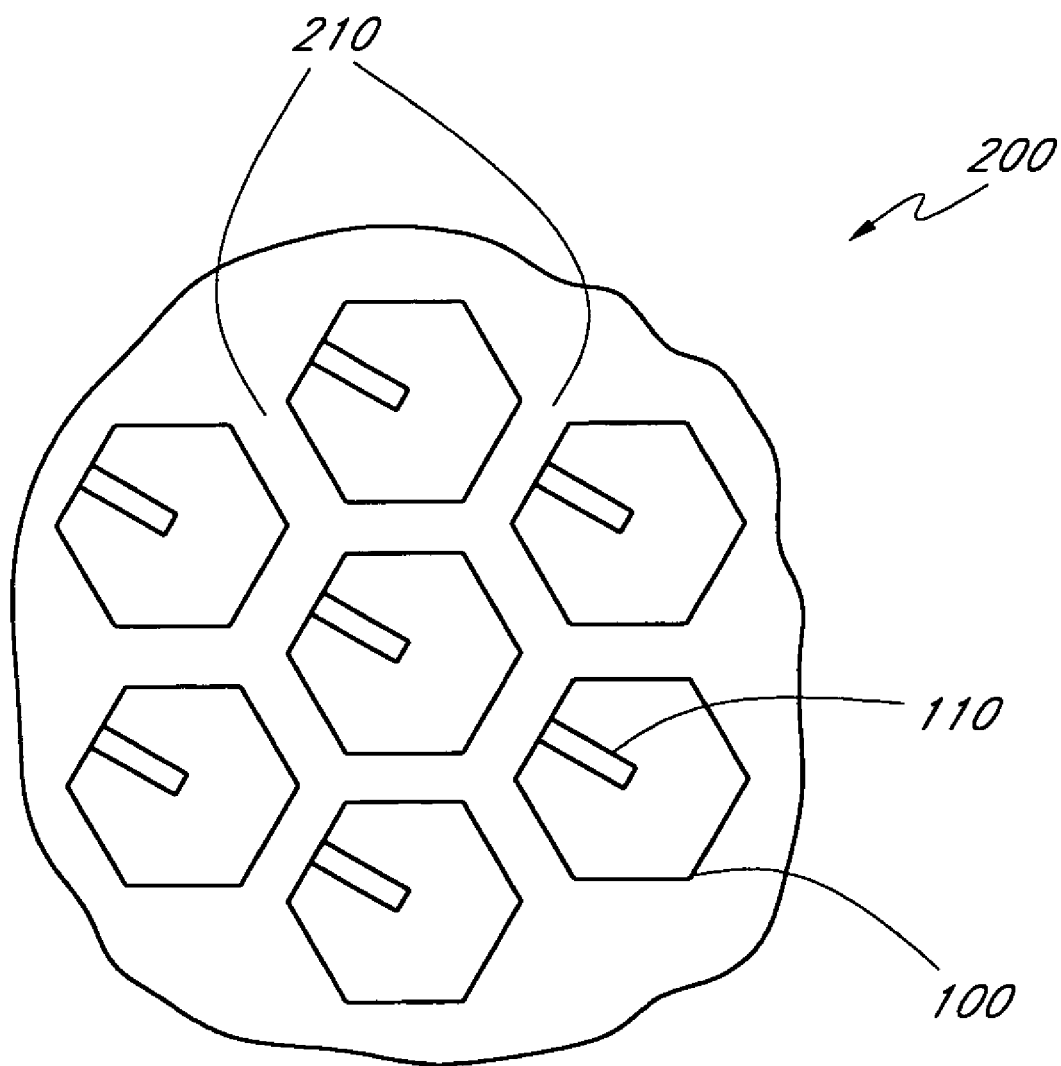
FIG. 3B is another schematic top-down plan view of the array of FIG. 2, in accordance with other preferred embodiments of the invention.

With reference to FIGS. 3A and 3B, it will be appreciated that radiation typically diffuses over an irradiated area. To prevent unintentionally irradiating a neighboring area, the array 200 is preferably provided with shields 210 to limit and direct radiation propagation to desired parts of the surface 140 (FIG. 2). For example, where the emitted radiation is optical, the shields 210 can be an opaque material. Preferably, as illustrated, the shields 210 are walls which separate and define each microscanner 100. The shields 210 can defined various shapes, two of which, squares and hexagons, are illustrated in FIGS. 3A and 3B, respectively. A shape such as a square has advantages for placing the probes 110 in regular rows and columns and a shape such as a hexagon can have advantages for even propagation of radiation.

It will be appreciated that the array 200 and microscanners 100 can be formed by various techniques for forming microelectromechanical systems known in the art of microelectromechanical systems fabrication. For example, the various parts, e.g., the shield 210, the probe 110, e.g., a cantilever, and the tip 130, of the microscanner 100 are preferably formed from a silicon substrate and shaped using various micromachning techniques known in the art. In addition, the tip 130 can be formed by various erosion techniques known in the art. Preferably, the microscanners 100 are provided without individual actuators 112, to simplify fabrication. Rather, movement of the probes 110 relative to the surface 140 is preferably accomplished by moving the surface 140. Arrays of microelectromechanical systems with cantilevers and platforms for moving an object with high precision are discussed in Vettiger et al., The "Millipede"—Nanotechnology Entering Data Storage, IEEE Trans. Nanotechnol. Vol. 1, No. 1, March 2002, p. 39-55 and at http://www.zurich.ibm.com/st/storage/millipede.html and related linked pages, the entire disclosures of which are incorporated herein by reference.

Figure 4:
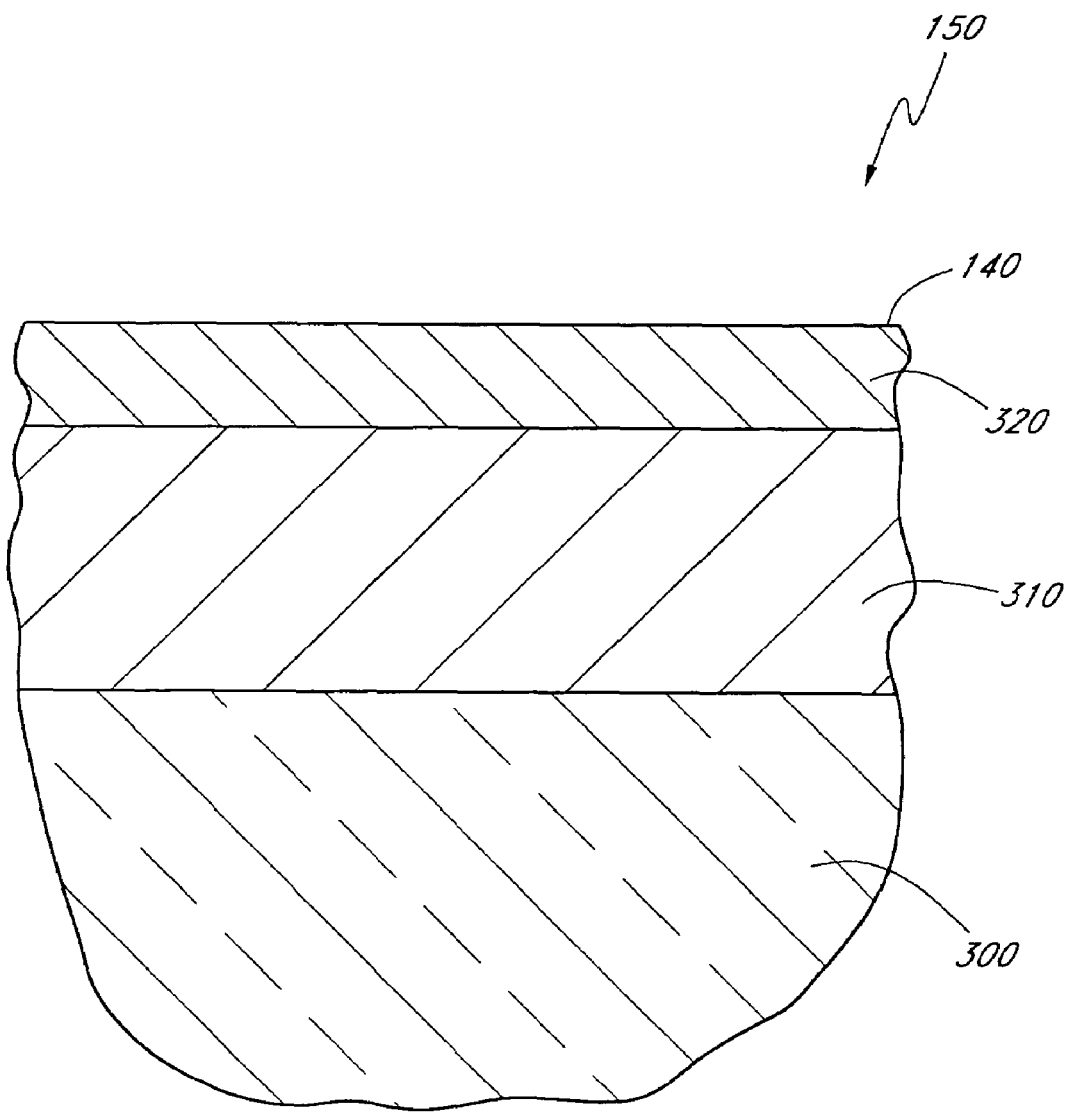
FIG. 4 is a schematic, cross-sectional side view of a partially formed integrated circuit, in accordance with preferred embodiments of the invention.

With reference to FIG. 4, the printing techniques disclosed herein can be applied in the fabrication of integrated circuits, including the fabrication of memory devices, e.g., DRAM, phase change RAM, programmable conductor (PCRAM), ROM or flash memory, and computer processors. In the illustrated embodiment, the partially fabricated integrated circuit 150 comprises a substrate 300 to be processed through a mask, and is provided with an overlying hard mask layer 310, over which lies a photocatalytically active masking layer 320, having the surface 140. Preferably, the masking layer 320 is a self-assembling monolayer.

Figure 5:
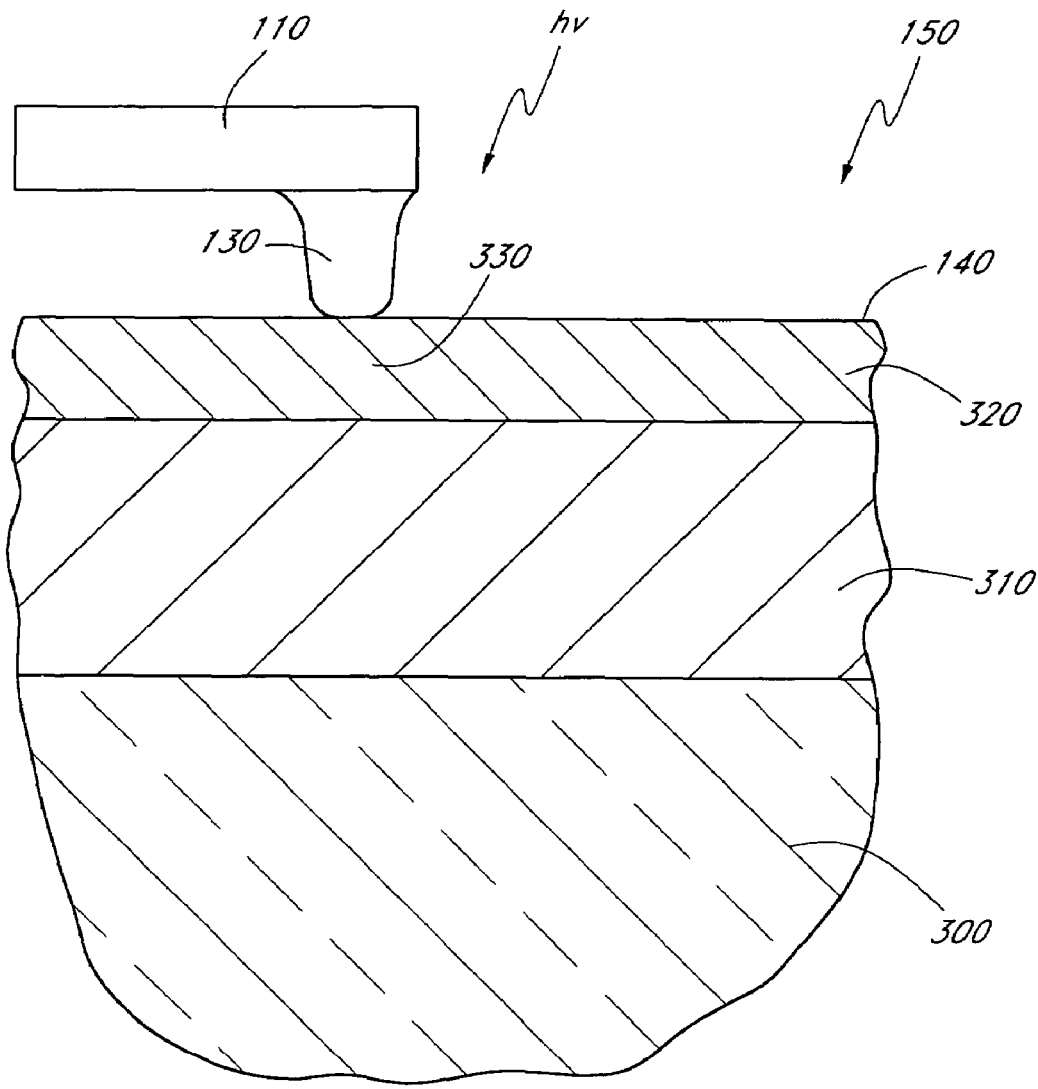
FIG. 5 is a schematic, cross-sectional side view of the partially formed integrated circuit of FIG. 4 being printed by a micro-scanner probe, in accordance with preferred embodiments of the invention.

With reference to FIG. 5, the tip 130 of a probe 110 is scanned over the surface 140 of the photocatalytically active layer 320. Light energy is applied to print on the photocatalytically active layer 320. The light causes a chemical reaction in the part 330 of the layer 320 that is contacted by the tip 130, thereby transforming the part 330 into a chemical species which can be selectively removed relative to the remaining unreacted parts of the photocatalytically active masking layer 320. Thus, a pattern is written on the photocatalytically active masking layer 320.

Figure 6:
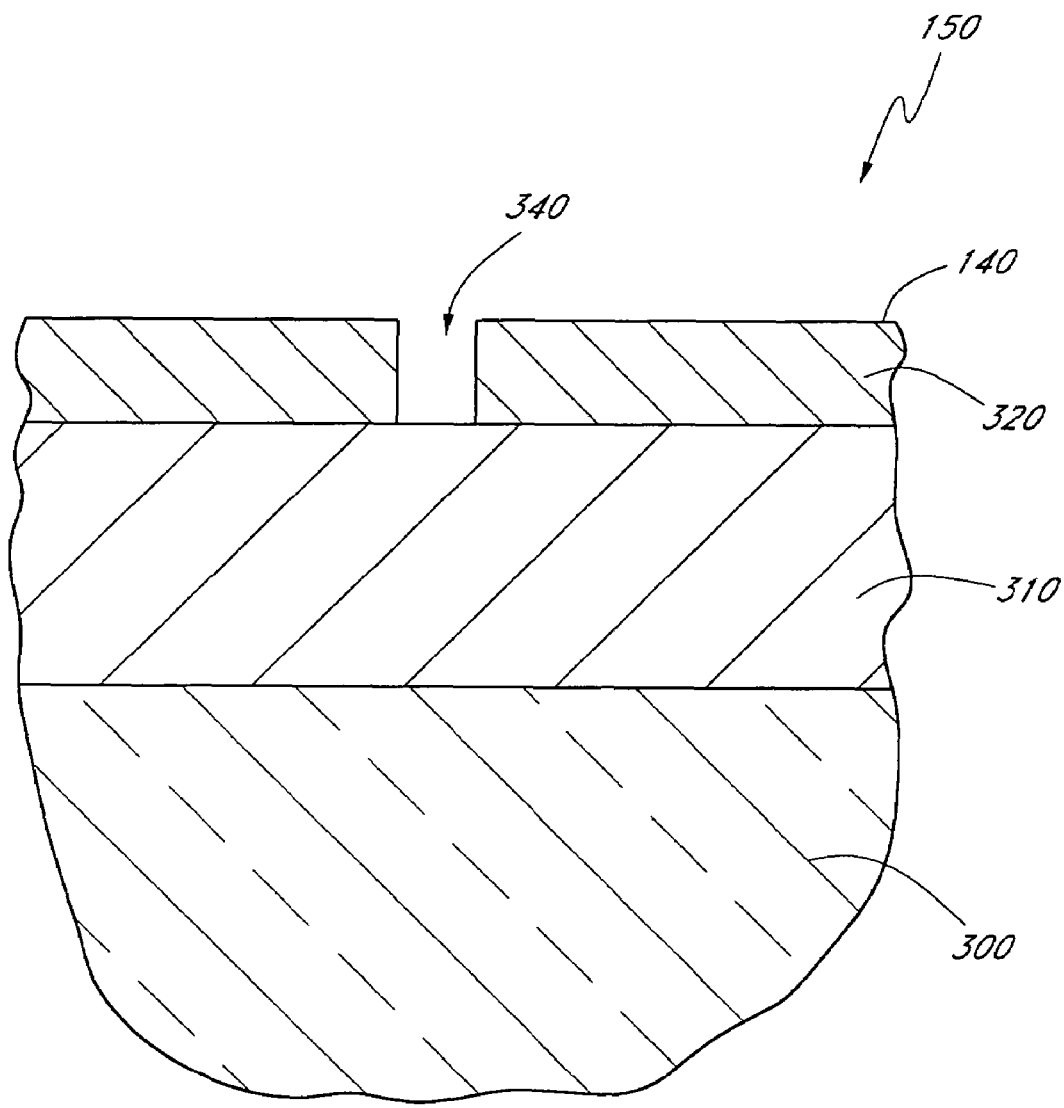
FIG. 6 is a schematic, cross-sectional side view of the partially formed integrated circuit of FIG. 5 after removing reacted masking material, in accordance with preferred embodiments of the invention.
Figure 7:
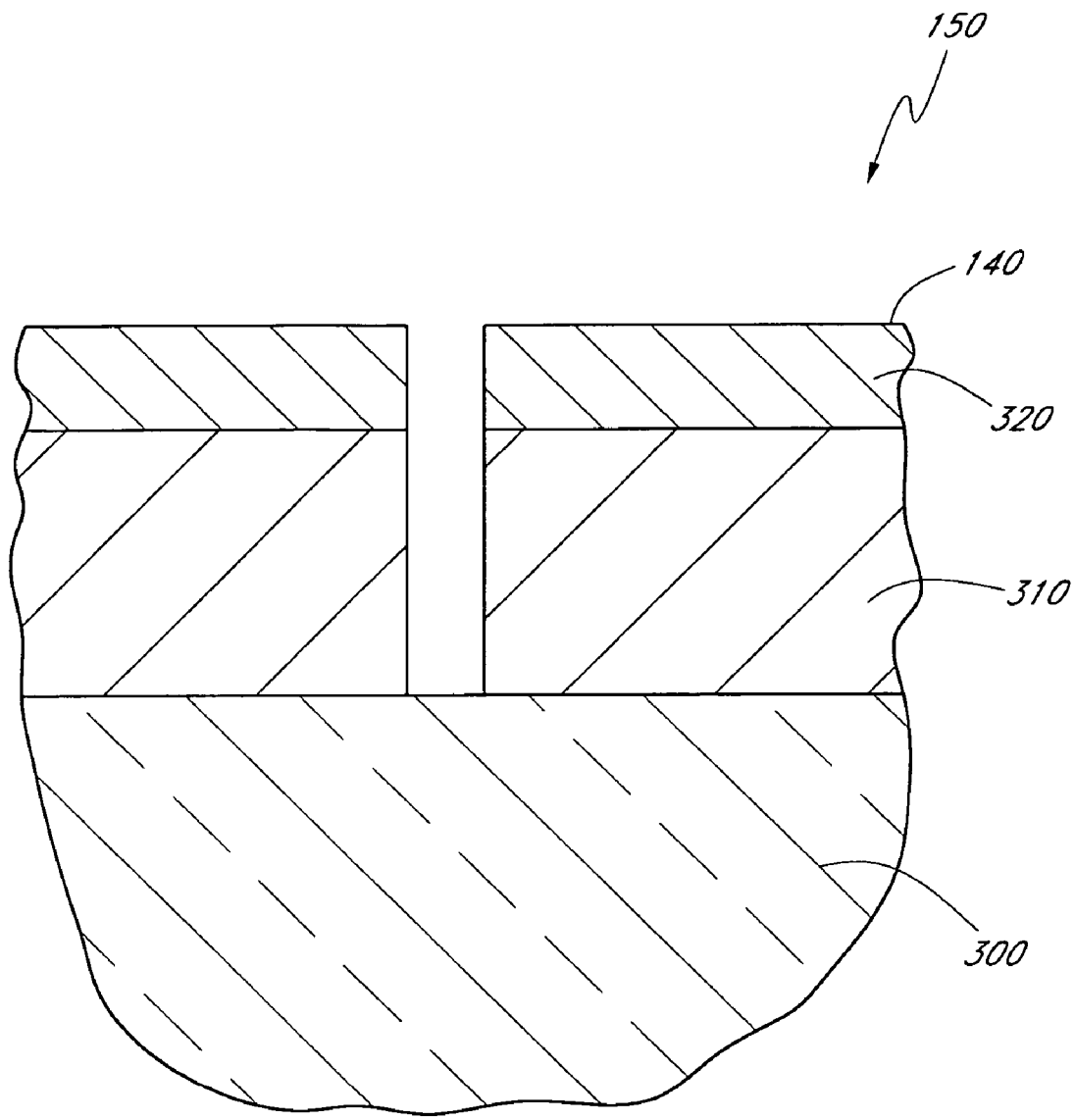
FIG. 7 is a schematic, cross-sectional side view of the partially formed integrated circuit of FIG. 6 after transferring a pattern from the masking layer to a hard mask layer, in accordance with preferred embodiments of the invention.

With reference to FIG. 6, the reacted part 330 (FIG. 5) is selectively removed, e.g., by an anisotropic etch selective for the reacted part 330, to leave a void 340. With reference to FIG. 7, the pattern in the photocatalytically active masking layer 320 is transferred to the hard mask layer 310. Preferably, material forming the hard mask layer 310 is chosen to be selectively etchable relative to the unreacted material of the layer 320. Thus, the hard mask layer 310 is selectively etched relative to the masking layer 320 to transfer the pattern in the masking layer 320 to the hard mask layer 310. The transfer can be accomplished using e.g., an anisotropic etch selective for the material of the hard mask layer 310.

Figure 8:
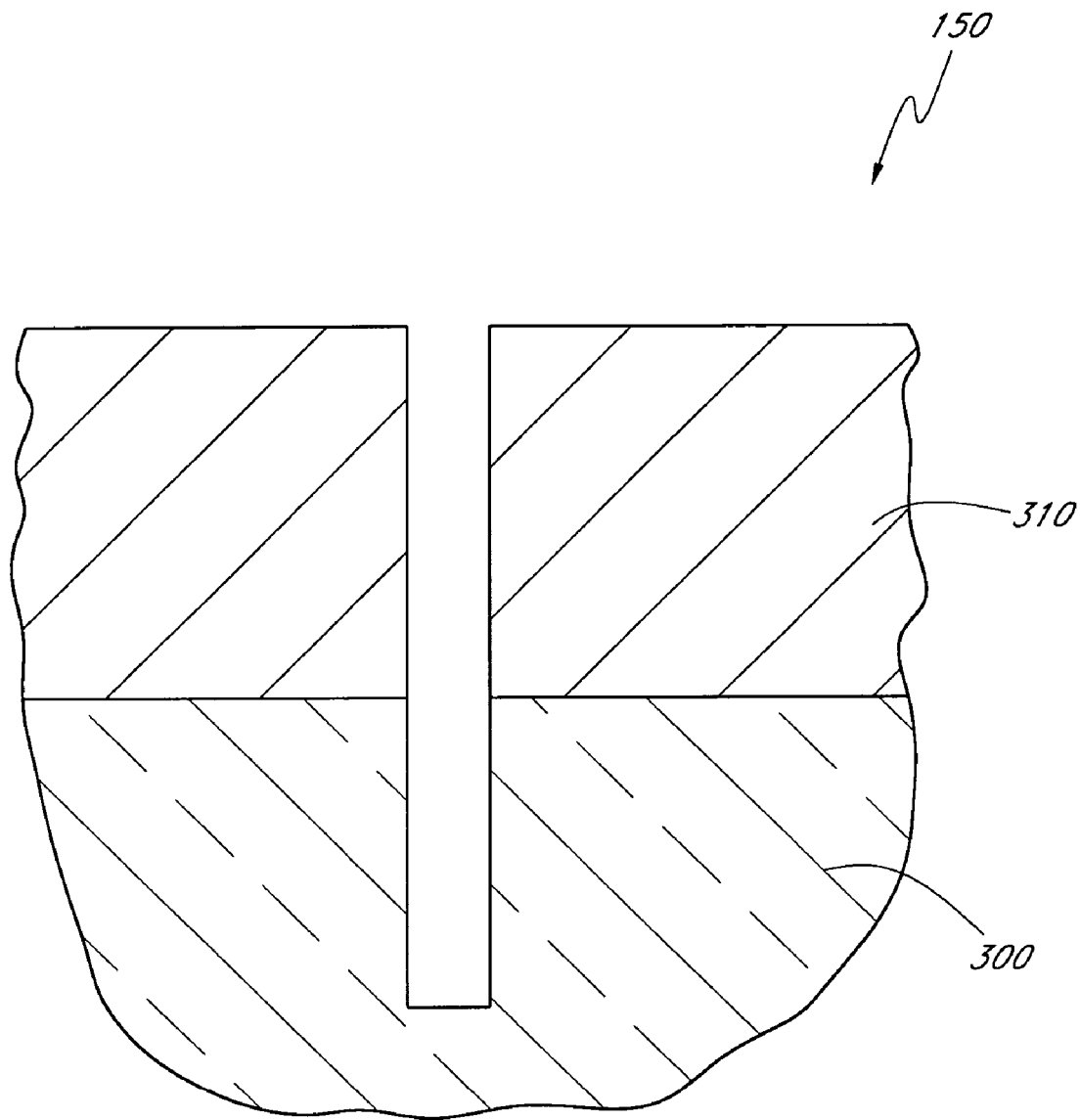
FIG. 8 is a schematic, cross-sectional side view of the partially formed integrated circuit of FIG. 7 after transferring the pattern in the hard mask layer into the underlying substrate, in accordance with preferred embodiments of the invention.

With reference to FIG. 8, the substrate 300 is processed through the hard mask layer 310. The material for the hard mask layer 310 is preferably also selected so that the substrate 300 can be selectively etched relative to the layer 310. Thus, in the illustrated embodiment, the substrate 300 is selectively etched relative to the hard mask layer 310. The resulting pattern of voids in the substrate 300 can be used to form various electrical features, including interconnects and electrical devices, such as capacitors and transistors. It will be appreciated that the masking layer 320 can be removed before or after processing the substrate 300 through the hard mask layer 310. Preferably, the removal is accomplished using a dry etch, although a wet etch with sufficient selectivity may be suitable, especially if the masking layer 320 is thin (e.g., a monolayer).

It will also be appreciated that various additional masks can be provided between the hard mask layer 310 and the substrate 300, depending upon, e.g., the availability of suitable materials and etch chemistries. Moreover, while "processing" through the various mask layers preferably involves etching an underlying layer, processing through the mask layers can involve subjecting layers underlying the mask layers to any semiconductor fabrication process. For example, processing can involve ion implantation, diffusion doping, depositing, or wet etching, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. Provisional Patent Application No. 60/666,031, filed Mar. 28, 2005, the entire disclosure of which is incorporated by reference herein.

Moreover, various other modifications are possible. For example, while the tip 130 preferably terminated in a nanodot, which is attached or grown on the tip to facilitate patterning of very small or narrow pitch features, the tip 130 can be a larger structure in some embodiments. For example, larger sized or larger pitch features can be formed using larger-sized tip ends. In some embodiments, micromachining techniques may be sufficient to form a tip end having desired dimensions. In such cases, the tip end is preferably photocatalytically active to allow for printing, as discussed above. Also, the preferred embodiments can be used with various chemical systems, e.g., involving chemical species other than amines and reactions other than the reduction of amines, to print exceptionally small, e.g., nano-size, circuits.

In addition, while illustrated applied to an exemplary sequence for fabricating integrated circuits, it will be appreciated that the preferred embodiments can be applied in various other applications when the formation of patterns with very small features is desired. For example, the preferred embodiments can be applied to form templates or masks for other lithography techniques, including X-ray or imprint lithography.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

I claim:

1. A method for fabricating an integrated circuit, comprising:

moving an array of regularly spaced nanodots over a surface of a partially fabricated integrated circuit, each nanodot having a different associated light source, wherein each light source is independently controlled; and directing light energy from the associated light source to the one of the nanodots associated with the light source when the nanodot is positioned over a desired location on the surface, thereby defining a pattern on the surface, while light sources associated with others of the nanodots, which are not at desired locations on the surface, do not direct light energy to the surface of the partially fabricated integrated circuit.

2. The method of claim 1, wherein each nanodot is affixed to a cantilever.

3. The method of claim 1, wherein moving comprises raster-scanning the nanodots over the surface.

4. The method of claim 1, wherein directing light energy comprises catalyzing a chemical reaction on the surface.

5. The method of claim 4, wherein catalyzing the chemical reaction comprises a reduction.

6. The method of claim 1, wherein catalyzing the chemical reaction comprises converting an aromatic azide into an aromatic amine.

7. The method of claim 4, wherein the nanodot comprises a light-activated electron donor.

8. The method of claim 7, wherein the nanodot comprises cadmium and one or more elements selected from the group consisting of sulfur and selenium.

9. The method of claim 7, further comprising replenishing donated electrons in the nanodot by transferring electrons from a sacrificial electron donor.

10. The method of claim 9, wherein the nanodot and the partially fabricated integrated circuit are immersed in a solution comprising sodium formate.

11. The method of claim 1, wherein directing light energy to the nanodot comprises calculating a position of the nanodot based upon a starting position of the nanodot and a lateral velocity and direction of the nanodot.

12. The method of claim 1, wherein directing light energy to the nanodot comprises actively detecting a position of the nanodot.

13. The method of claim 12, wherein actively detecting comprises magnetically or electromagnetically sensing a position of the nanodot.

14. The method of claim 12, wherein actively detecting comprises directing energy from a laser to the nanodot.

15. A method for printing a pattern over a semiconductor substrate, comprising:

providing a photochemically active material over the partially fabricated integrated circuit;

providing a micromechanical system comprising:

a plurality of probes, each probe comprising a tip terminating in a nanodot; and a plurality of independently controlled light sources, each light source associated with a nanodot;

moving the nanodots across a surface of the material; and intermittently irradiating the nanodots to cause a chemical reaction at an interface of the nanodot and the surface.

16. The method of claim 15, wherein the nanodot is a photocatalyst.

17. The method of claim 15, wherein intermittently irradiating the nanodot comprises exposing the nanodot to optical light.

18. The method of claim 15, wherein the interface has a width of about 20 nm or less.

19. A method for patterning a surface of a partially fabricated integrated circuit, comprising:

providing a plurality of probes, each probe comprising a tip:

providing a plurality of independently controlled radiation sources, each radiation source associated with one of the probes:

forming a self-assembling monolayer on a substrate, wherein the self-assembling monolayer defines the surface of the partially fabricated integrated circuit; and contacting the surface with the tips while irradiating selected areas of the surface while not irradiating other areas of the surface, thereby defining a pattern on a portion of the selected areas.

20. The method of claim 19, wherein irradiating selected areas comprises catalyzing a chemical reaction in parts of the selected areas.

21. The method of claim 20, wherein catalyzing the chemical reaction comprises focusing the catalysis with a probe, wherein catalyzing the chemical reaction occurs at an interface of a tip of the probe and the surface.

22. The method of claim 21, wherein the tip of the probe comprises a nanodot.

23. The method of claim 19, wherein the selected portions are squares having a width of less than about 100 µm.

24. The method of claim 19, wherein the partially fabricated integrated circuit is a partially fabricated memory device.

25. The method of claim 19, wherein the partially fabricated integrated circuit is a partially fabricated computer processor.

26. The method of claim 19, wherein the self-assembling monolayer is a self-terminating monolayer comprising photochemically active moieties having attached ligands, wherein the ligands are reactive with the substrate and non-reactive with the photochemically active moieties.

27. The method of claim 26, wherein the ligands comprise hydrocarbon chains.

* * * * *

UNITED STATES PATENT AND TRADEMARK OFFICE
CERTIFICATE OF CORRECTION

PATENT NO. : 7,598,021 B2  
APPLICATION NO. : 11/252465  
DATED : October 6, 2009  
INVENTOR(S) : Gurtej S. Sandhu Page 1 of 1

It is certified that error appears in the above-identified patent and that said Letters Patent is hereby corrected as shown below:

In column 11, line 16, in Claim 19, delete "tip:" and insert -- tip; --, therefor.

In column 11, line 19, in Claim 19, delete "probes:" and insert -- probes; --, therefor.

In column 11, line 24, in Claim 19, delete "surface" and insert -- surface, --, therefor.

Signed and Sealed this

Twenty-fourth Day of November, 2009

David J. Kappos  
*Director of the United States Patent and Trademark Office*

UNITED STATES PATENT AND TRADEMARK OFFICE
CERTIFICATE OF CORRECTION

PATENT NO.        : 7,598,021 B2
APPLICATION NO. : 11/252465
DATED             : October 6, 2009
INVENTOR(S)      : Gurtej S. Sandhu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 770 days.

Signed and Sealed this

Twenty-eighth Day of September, 2010

David J. Kappos
*Director of the United States Patent and Trademark Office*